US012310159B2

(12) United States Patent
Chen et al.

(10) Patent No.: US 12,310,159 B2
(45) Date of Patent: May 20, 2025

(54) INTEGRATED STRUCTURE FOR AN OPTOELECTRONIC DEVICE AND METHOD OF FABRICATING THE SAME

(71) Applicant: MASSACHUSETTS INSTITUTE OF TECHNOLOGY, Cambridge, MA (US)

(72) Inventors: Yijing Chen, Singapore (SG); Li Zhang, Singapore (SG); Kenneth Eng Kian Lee, Singapore (SG); Eugene A. Fitzgerald, Singapore (SG)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 479 days.

(21) Appl. No.: 17/622,097

(22) PCT Filed: Jun. 24, 2020

(86) PCT No.: PCT/SG2020/050357
§ 371 (c)(1),
(2) Date: Dec. 22, 2021

(87) PCT Pub. No.: WO2020/263183
PCT Pub. Date: Dec. 30, 2020

(65) Prior Publication Data
US 2022/0246670 A1    Aug. 4, 2022

(30) Foreign Application Priority Data
Jun. 28, 2019    (SG) .............................. 10201906072T

(51) Int. Cl.
*H10H 29/10*    (2025.01)
*H10H 20/01*    (2025.01)
(Continued)

(52) U.S. Cl.
CPC ............ *H10H 29/10* (2025.01); *H10H 20/01* (2025.01); *H10H 20/855* (2025.01);
(Continued)

(58) Field of Classification Search
None
See application file for complete search history.

(56) References Cited

U.S. PATENT DOCUMENTS 10,325,894 B1 *    6/2019    Pan ...................... H01L 25/167
2004/0036074 A1    2/2004    Kondo
(Continued)

FOREIGN PATENT DOCUMENTS

JP    2012516120 A    7/2012
JP    2015095517 A    5/2015
(Continued)

OTHER PUBLICATIONS

Non-Final Notice of Reasons for Rejection issued in corresponding Japanese Patent Application No. 2021-576651 on Jan. 23, 2024. (Machine Translation Provided).
(Continued)

*Primary Examiner* — Benjamin P Sandvik
(74) *Attorney, Agent, or Firm* — Volpe Koenig

(57) ABSTRACT

An integrated structure for an optoelectronic device and a method of fabricating an integrated structure for an optoelectronic device. The method comprises the steps of providing a complementary metal-oxide-semiconductor, CMOS, backplane comprising a driver circuit for the optoelectronic device; and providing a plurality of optical elements on the CMOS backplane, wherein the plurality of optical elements are based on a material system different from CMOS and are disposed in different device layers; wherein a first bonding dielectric is provided between the CMOS backplane and a first one of the different device (Continued)

layers for monolithic integration; and wherein a second bonding dielectric is provided between respective ones of the different device layers for monolithic integration, the second bonding dielectric being transparent.

20 Claims, 14 Drawing Sheets

(51) Int. Cl.
  *H10H 20/855* (2025.01)
  *H10H 20/856* (2025.01)
  *H10H 20/80* (2025.01)

(52) U.S. Cl.
  CPC ....... *H10H 20/856* (2025.01); *H10H 20/0363* (2025.01); *H10H 20/872* (2025.01)

(56) References Cited

U.S. PATENT DOCUMENTS

| | | | |
|---|---|---|---|
| 2009/0078963 A1* | 3/2009 | Khodja | H01S 5/0261 257/458 |
| 2018/0156965 A1* | 6/2018 | El-Ghoroury | G02B 6/0056 |
| 2019/0189596 A1 | 6/2019 | Chae | |
| 2019/0189681 A1 | 6/2019 | Chae | |
| 2021/0384182 A1* | 12/2021 | Xu | H10H 20/855 |

FOREIGN PATENT DOCUMENTS

| | | |
|---|---|---|
| JP | 2018-10958 A | 1/2018 |
| WO | 2018132070 A1 | 7/2018 |
| WO | 2018175338 A1 | 9/2018 |

OTHER PUBLICATIONS

Y. Robin et al. "Insight into the performance of multi-color InGaN/GaN nanorod light emitting diodes", Scientific Reports 8, 7311 (2018).

El-Ghoroury et al. "Light emitting structures with multiple uniformly populated active layers", US Patent No. US2016/0359086 (2016).

H.-V. Han et al. "Resonant-enhanced full-color emission of quantum-dot-based micro LED display technology" Optics Express 23, 32504 (2015).

Chong et al. "Making Semiconductor devices by stacking strata of micro LEDs", International Publication No. WO 2018/175338 (2018).

Search Report issued in corresponding Singapore Patent Application No. 11202113731Y on Dec. 25, 2023, consisting of 2 pp.

Written Opinion issued in corresponding Singapore Patent Application No. 11202113731Y on Dec. 25, 2023, consisting of 6 pp.

Office Action issued in corresponding Korean Patent Application No. 10-2022-7000963, on Sep. 20, 2024, 1 consisting of 19 pp. (English Translation Provided).

* cited by examiner

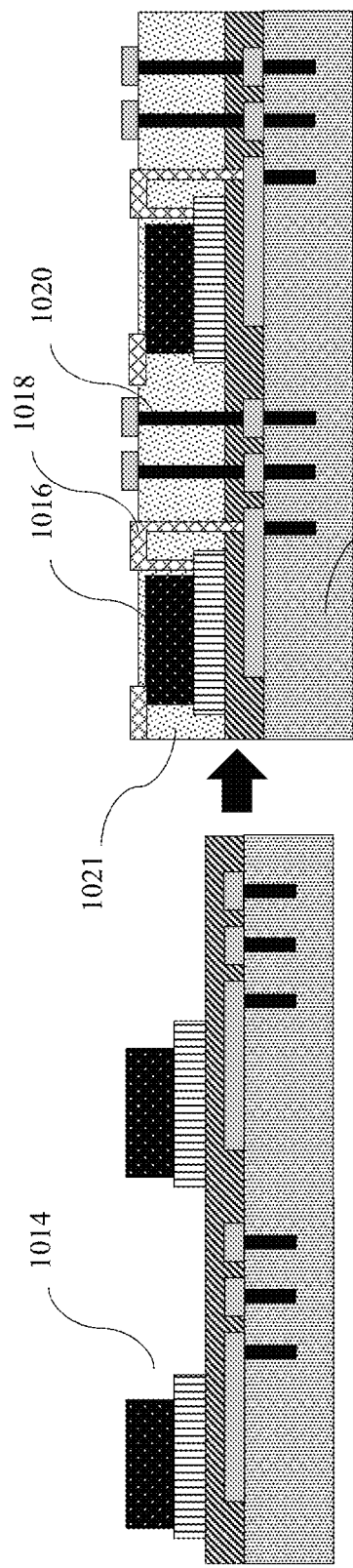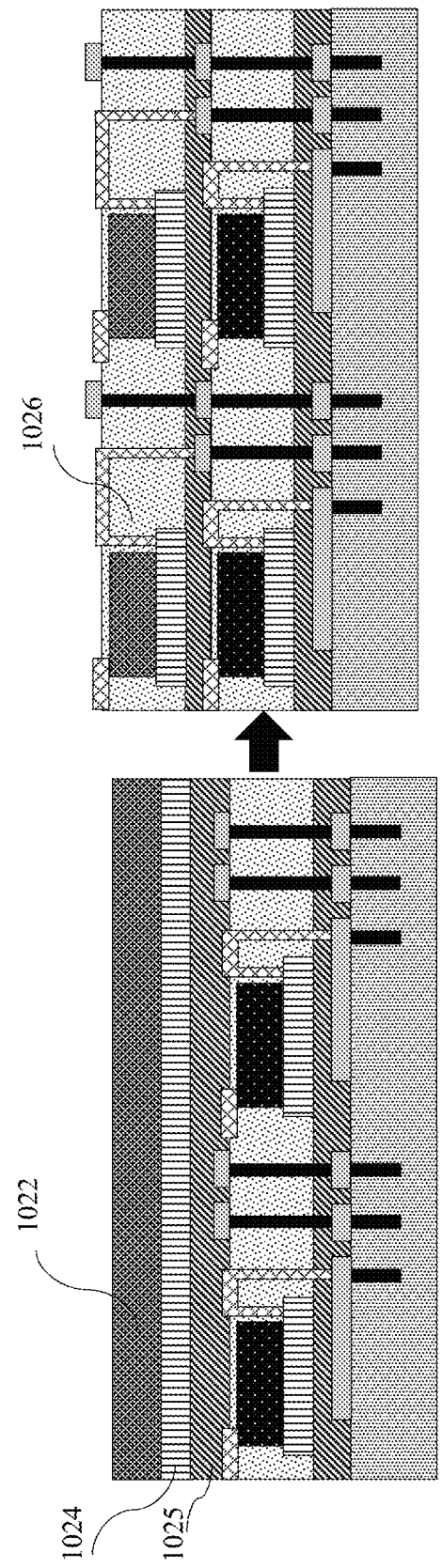

INTEGRATED STRUCTURE FOR AN OPTOELECTRONIC DEVICE AND METHOD OF FABRICATING THE SAME

FIELD OF INVENTION

The present invention relates broadly to an integrated structure for an optoelectronic device and to a method of fabricating an integrated structure for an optoelectronic device, in particular to a device architecture for monolithic full-color active-matrix micro-LED micro display with a CMOS backplane and the wafer-level manufacturing method to fabricate the same.

BACKGROUND

Any mention and/or discussion of prior art throughout the specification should not be considered, in any way, as an admission that this prior art is well known or forms part of common general knowledge in the field.

The conventional micro-display technologies, including liquid-crystal display, LCD, liquid crystal on silicon, LCOS, and active matrix organic light emitting diode, AMOLED, are generally not bright enough for today's augmented reality, AR, and head-up display, HUD, to see the images on a bright, sunlit day, nor efficient or compact enough to be used in wearable devices. Semiconductor-based micro-LED micro-display, on the other hand, naturally excels in brightness, contrast, speed, efficiency, reliability and compactness, which is highly attractive nowadays for wearable electronics and automotive devices. Other technologies such as digital light processing, DLP, can be bright, but the form factor and power efficiency are not ideal for wearable device.

Recently, there have been substantial interests in inorganic micro-LED micro display with pitch size <10 µm for near-eye and automotive applications like AR, HUD, etc. Compared with the conventional micro-display technologies (DLP, LCOS, organic light emitting diode, OLED, and LCD), micro-LED micro-display naturally excels in brightness, speed, efficiency, reliability and compactness, which is highly attractive for wearable electronics and automotive devices.

Although micro-LED micro displays are based on well-known and accepted core technologies semiconductor and complementary metal-oxide-semiconductor, CMOS, technologies), the manufacturing has been challenging. At larger pitch size >50 µm, R, G, B integration can be achieved through "pick and place" approach, i.e. individual micro-LEDs from separate epitaxial wafers (e.g. R, G, B) are transferred to the backplane in a massively parallel manner. However, when the pixel size shrinks to <20 um, such mass-transfer approaches become impractical. Instead, the entire micro-display has to be manufactured at waferscale as a monolithic structure for low-cost high-volume production. However, the complex hybrid integration involving nitride-based blue and green LEDs, arsenide-based red LEDs and the silicon-based CMOS poses significant manufacturing challenges.

Most of the prior attempts to resolve the monolithic R, G, B integration challenges involve innovations on the light emitting material, but face various practical limitations. For example, glo leads the gallium nitride nano-wire micro-LED technology for full-color micro-displays. However, as they are limited by the small filling ratio of the emissive nano-wire tips (i.e. the actual volume of nano-wire material that emits light is only a small fraction of the total chip size), its brightness is grossly insufficient for state-of-the-art AR applications, which require up to $10^6$ nits [1]. Ostendo attempts to integrate 3D heterogeneous electroluminescent LED layers for the different RGB colors, but experiences fabrication difficulties in achieving independent control of R, G, B emission [2]. It is also worthwhile to note that both technologies try to obtain red emission on the gallium nitride material platform, which generally has low-efficiency and has ultra-wide spectrum leading to poor color rendering. Many others are working on color conversion technology, i.e. selectively patterning the color-conversion quantum dots or quantum wells over the monochromatic blue/violet micro-LED arrays to down-convert the color to green and red [3]. However, the large thickness requirements for complete color conversion and the sidewall light leakage are common concerns with this approach, especially when the micro-LED shrinks to <5 µm. Quantum dots also face thermal reliability and photochemical stability issues, which are usually infeasible for on-chip integration. Thus, to date, how to get color on micro-LED micro-display remains an un-resolved issue, especially when mass-manufacturability comes into the discussion.

Other than the technologies described above, which are all generally impractical for mass manufacturing, there is another competing technology, namely monolithic hybrid integration technology, showing decent manufacturability for single-color micro-LED arrays but possessing significant challenges for RGB integration [4]. It utilizes wafer-level metal bonding technique to integrate R, G, B epitaxial, epi, on the integrated circuit, IC, wafer and uses standard semiconductor processing to pattern the micro-LEDs after each bonding. The R, G, B micro-LED arrays are interlaced and stacked, with each micro-LED individually connected to the driver circuit in the CMOS backplane. This technology faces a series of drawbacks, e.g. yield loss due to the high-temperature high-pressure metal bonding process, the metal contamination during the pixel isolation, process compatibility with the bonding material, metal choices for balancing bonding quality and optical reflectance. Also, transferring the process to existing manufacturing infrastructure is difficult due to the involvement of CMOS-non-compatible metal in the bonding layer.

Embodiments of the present invention seek to address at least one of the above problems.

SUMMARY

In accordance with a first aspect of the present invention, there is provided an integrated structure for an optoelectronic device, the integrated structure comprising:
  a complementary metal-oxide-semiconductor, CMOS, backplane comprising a driver circuit for the optoelectronic device;
  a plurality of optical elements on the CMOS backplane, wherein the plurality of optical elements are based on a material system different from CMOS and are disposed in different device layers;
  a first bonding dielectric provided between the CMOS backplane and a first one of the different device layers for monolithic integration; and
  a second bonding dielectric provided between respective ones of the different device layers for monolithic integration, the second bonding dielectric being transparent.

In accordance with a first aspect of the present invention, there is provided a method of fabricating an integrated structure for an optoelectronic device, the method comprising the steps of:

providing a complementary metal-oxide-semiconductor, CMOS, backplane comprising a driver circuit for the optoelectronic device; and providing a plurality of optical elements on the CMOS backplane, wherein the plurality of optical elements are based on a material system different from CMOS and are disposed in different device layers;

wherein a first bonding dielectric is provided between the CMOS backplane and a first one of the different device layers for monolithic integration; and wherein a second bonding dielectric is provided between respective ones of the different device layers for monolithic integration, the second bonding dielectric being transparent.

BRIEF DESCRIPTION OF THE DRAWINGS

Embodiments of the invention will be better understood and readily apparent to one of ordinary skill in the art from the following written description, by way of example only, and in conjunction with the drawings, in which:

FIG. 11 shows cross-sectional schematic drawings illustrating processing steps in a fabrication method according to an example embodiment.

FIG. 12 shows cross-sectional schematic drawings illustrating processing steps in a fabrication method according to an example embodiment.

DETAILED DESCRIPTION

Figure 1:
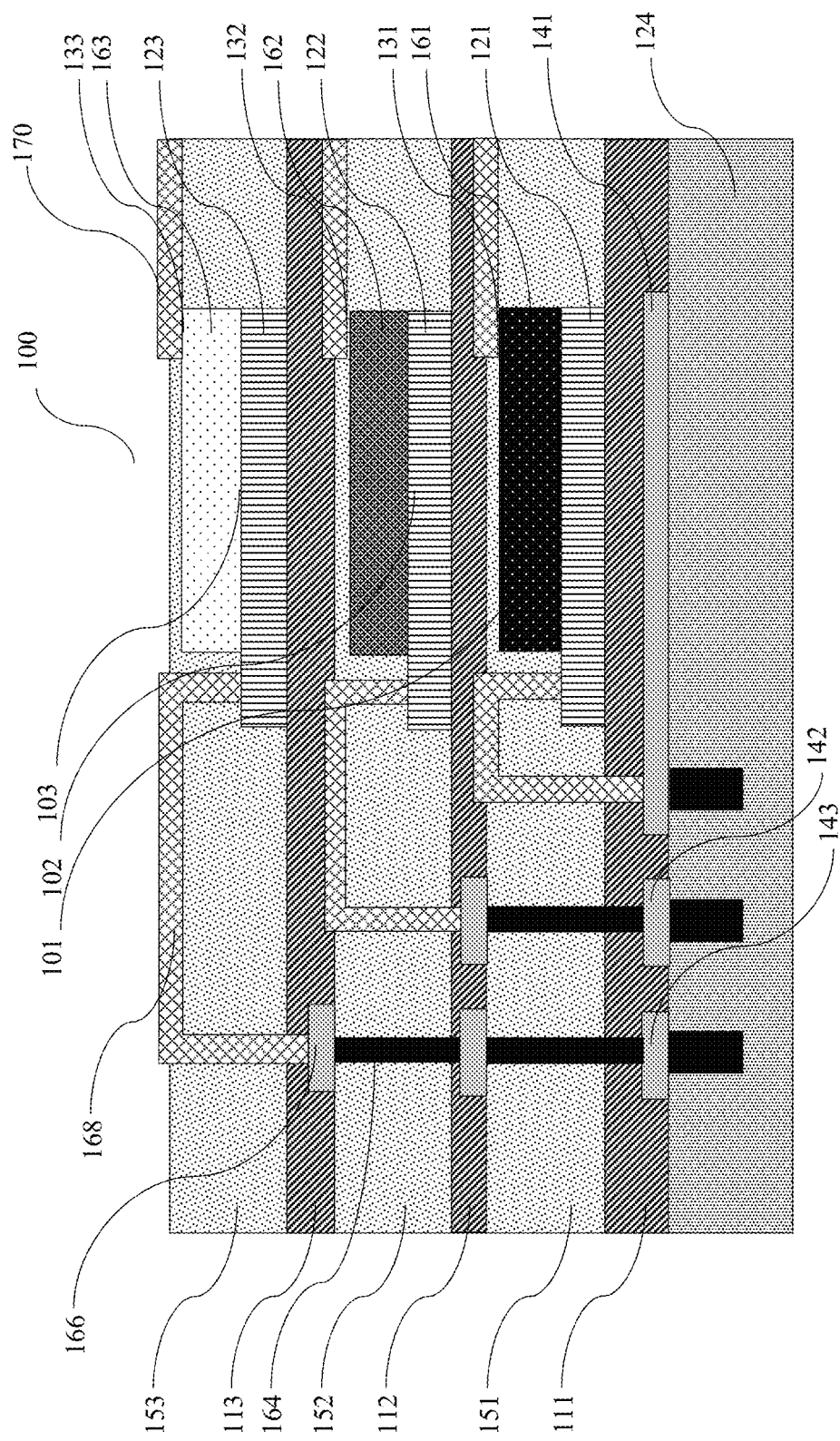
FIG. 1 shows a cross-sectional schematic drawing illustrating an integrated structure for an optoelectronic device in the form of a pixel structure for active-matrix micro-LED micro display with vertically stacked R, G, B micro-LEDs integrated through transparent dielectric bonding medium, according to an example embodiment.

Embodiments of the present invention provide a new device architecture and the mass-manufacturable approach to realize monolithic full-color micro-LED micro display without color conversion. The device according to an example embodiment features an array of R, G, B micro-LED pixels integrated on a silicon-based active-matrix display backplane, with each constituent micro-LED individually connected to and controlled by a pixel driver circuit in the backplane. Each pixel consists of vertically stacked native R, G, B micro-LEDs with the red LED at the bottom and the blue LED at the top. The R, G, B micro-LEDs are bonded through transparent dielectric medium, typically $SiO_2$, together with a long-pass reflector (e.g. distributed Bragg reflector, DBR,). The reflector is designed to transmit the long-wavelength light from the micro-LEDs below and reflect the short-wavelength light from the micro-LEDs above. Such vertical structure effectively addresses the resolution reduction issue commonly encountered in any monolithic RGB integration scheme, meanwhile optimizes the color rendering and color mixing with the micro-LED technology. The manufacturing method according to example embodiments is a CMOS compatible wafer-level process, based on multiple-transfers of epitaxial layers through dielectric wafer bonding process. For each color integration, the continuous epitaxial thin film is firstly bonded to the IC wafer via transparent dielectric medium, subsequently, micro-LEDs and the associated electrical connections are patterned using standard semiconductor processing. The detailed process flow according to example embodiments is designed to be CMOS compatible and readily transferred to the existing foundries for mass production.

The manufacturing approach according to example embodiments can overcome all the limitations with the prior-arts. First of all, an 8-inch, CMOS-compatible, wafer-level process can be provided according to an example embodiment, which promises low-cost large-scale mass production. Secondly, the process according to an example embodiment relies on highly established semiconductor processing and commercially available LED epitaxial wafers, which makes the process readily transferrable to the existing foundries. Thirdly, no precise bonding alignment is required, thus display resolution as high as 10000 ppi is practically achievable according to an example embodiment.

In terms of device architecture, embodiments of the present invention can provide significant advantages. It is known that the emission efficiency of micro-LED reduces as the size shrinks due to the increased sidewall nonradiative recombination. Such reduction becomes exponential, particularly as the size <10 µm. To accommodate R, G, B micro-LEDs in a same chip without compromising the display resolution, the current practice is to reduce the micro-LED size and arrange them in an interlaced manner. By doing that, one has to bear the consequence of significant reduction in brightness. The device structure according to example embodiments can effectively eliminate this issue. Meanwhile, the device structure according to example embodiments can also provide the optimal color mixing and reduces challenges for the integrated micro-optics design.

Other than the visible LED, invisible LED or other light-emitting devices, such as lasers, as well as light-detection devices are also applicable according to different example embodiments, without losing the generality.

FIG. 1 shows a cross-sectional schematic drawing illustrating a pixel structure 100 according to an example embodiment, for active-matrix micro-LED micro display with vertically stacked R, G, B micro-LEDs 101-103 integrated through transparent dielectric bonding medium 111-113. The respective bottom n-contacts 121-123 of the micro-LED 101-103 is individually connected to the driver circuit (not shown) in the display backplane 124 and the respective top p-contacts 131-133 of the micro-LEDs 101-103 of the same color are connected to a common electrode (not shown). The common electrodes from different device layers can be interconnected.

The interconnect metal pad e.g. 141, which may be made from e.g. Al, Cu, etc., on the display backplane 124 can advantageously serve as an optical reflector. Respective interconnections 141-143 to the pixel driver circuits for the micro-LEDS 101-103 are provided in the display backplane 124.

The bottom contacts 121-123 advantageously function as reflectors, which are transparent to the light emitted from the micro-LED below it. The bottom contacts 121-123 can comprise doped epi and conductive material that forms ohmic contact with the epi. The bottom contact 121-123 functioning as optical reflectors preferably exhibit high optical reflectivity to the light emitted from the LEDs above, and high transmittance to the light emitted from the LEDs below it.

The transparent bonding dielectric medium 111-113 may comprise, for example, SiO2, SiN, benzocyclobutene (BCB), etc. Dielectric insulating fillings 151-153, for example SiO2, spin on glass, BCB, etc., are provided for each micro-LED 101-103.

In the micro-LEDs 101-103, respective epi 161-163 of different band gap energy are used, each consisting of doped epi at top and bottom portion and light emitting epi, e.g. quantum well, in between. The epi 163 in the top micro-LED 103 has the largest band gap energy and the epi 161 at the bottom micro-LED 101 has the smallest band gap energy. The respective bottom portions of the epi 161-163 devices are individually connected to the pixel driver in the backplane 124, via vertical interconnects e.g. 164, for example in the form of Tungsten plugs, interconnect metal pads e.g. 166, for example made from Al, Cu, etc., and electrical interconnections e.g. 168 that form ohmic contact with the micro-LED bottom contacts e.g. 123. The interconnection e.g. 168 comprise conductive material that establish vertical/horizontal connection (e.g. metal, tungsten, transparent conducting oxide), passivation, adhesion layers etc.

The respective top contacts 131-133 of the micro-LEDs 101-103 in the same layer of the micro-LED micro display are electrically connected to a common electrode (not shown) via electrical interconnections e.g. 170 that form ohmic contact with the micro-LED top contacts e.g. 133. The interconnects e.g. 170 comprise conductive material that establish vertical/horizontal connection (e.g. metal, tungsten, transparent conducting oxide), passivation, adhesion etc.

Figure 2:
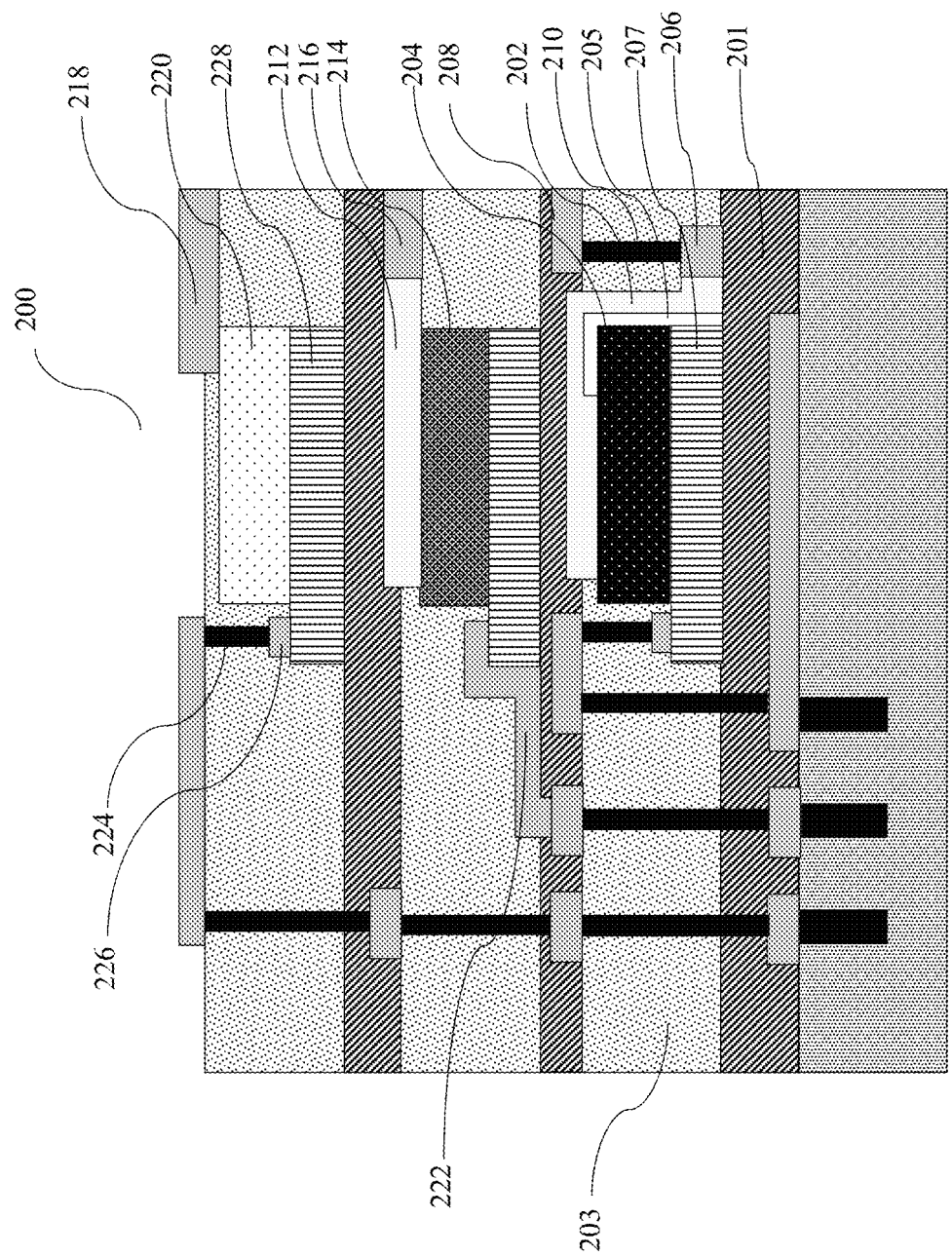
FIG. 2 shows a cross-sectional schematic drawing illustrating different configurations to establish the electric interconnection in a pixel structure according to different embodiments.

FIG. 2 shows a cross-sectional schematic drawing illustrating different configurations to establish the electric interconnection in pixel structure 100, indicated as numeral 200 in FIG. 2, according to example embodiments, including transparent bonding dielectric e.g. 201 for monolithic integration. Also, transparent filling e.g. 203 is used again in the device layers.

It is noted that the different configurations for the electrical interconnection according to example embodiments as illustrated in FIG. 2 are generally applicable to any of the device layers in the pixel structure 200. They can be utilized in combination, and do not have to be identical among different device layers. These configurations are also applicable to other pixel structures described herein according to other embodiments of the present invention.

In a first configuration according to an example embodiments, a transparent conducting oxide 202 forms ohmic contact with the micro-LED epi 204. A passivation layer 205 is provided for electrical isolation from the bottom contact 207. Metal pad/line/nets 206, 208 serve as the current spreading structure that connects to the common electrode (not shown). The transparent conducting oxide 202 is connected to metal pad 206 which in turn is connected to the metal line/net 208 through a tungsten plug 210 in this example embodiment.

In another configuration according to an example embodiment, transparent conducting oxide 212 forms ohmic contact with the micro-LED epi 214. Metal pad/line/nets 216 in contact with the transparent conducting oxide 212 establish electrical connection with the common electrode (not shown).

In another configuration according to an example embodiment, metal pad 218 touches part of the micro-LED epi 220 top surface to establish ohmic contact with epi 220 and for electrical connection with the common electrode (not shown).

For the bottom contact interconnection according to an example embodiment for the epi 214, metal pad/line 222 is used to establish direct interconnection. It is noted that insulation and adhesion structures are not shown in FIG. 2, but their use is understood by a person skilled in the art.

In another configuration for the bottom contact interconnection according to an example embodiment for the epi 220, a tungsten plug 224 is used to make contact to a metal pad 226 on the bottom contact 228. In FIG. 2, this configuration is also used for the bottom contact interconnection for the epi 204.

Figure 3:
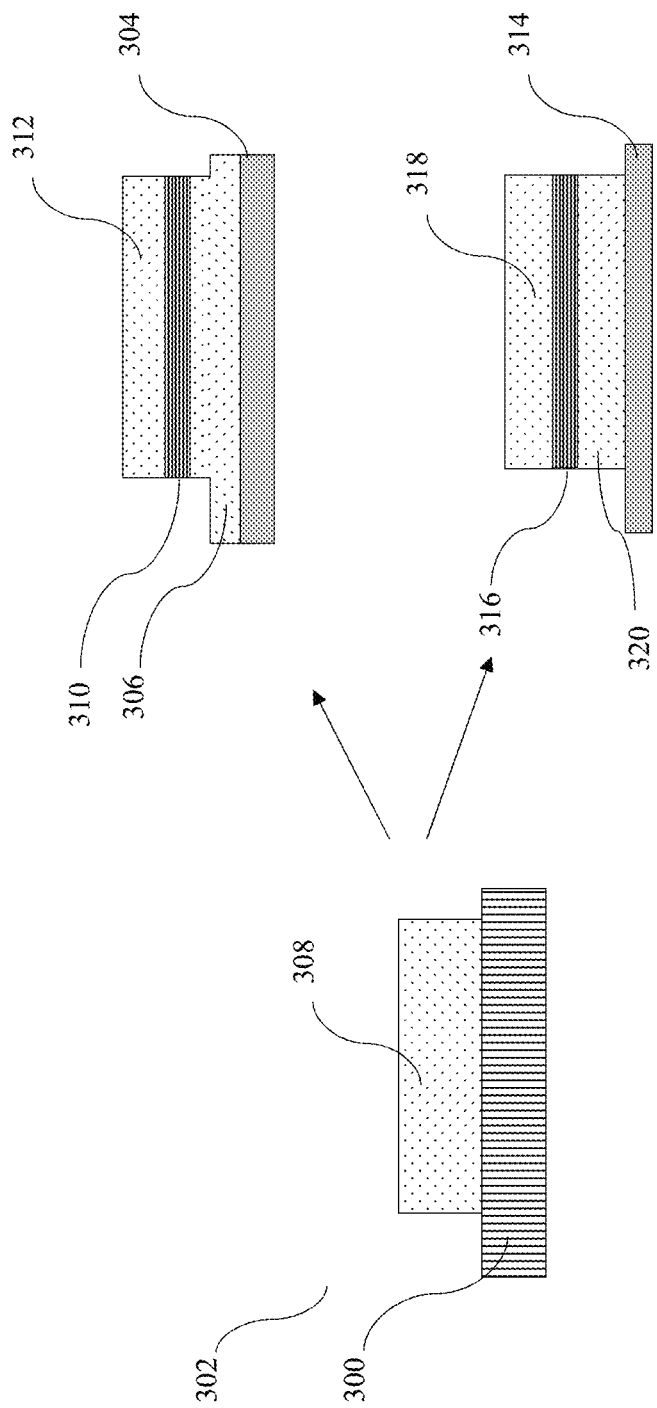
FIG. 3 shows cross-sectional schematic drawings illustrating different structures for micro-LED for use in example embodiments.

FIG. 3 shows cross-sectional schematic drawings illustrating details of different structures for the micro-LEDs in the structure 100, 200 according to example embodiments.

The different structures for the micro-LEDs according to example embodiments as illustrated in FIG. 3 are generally applicable to any device layer in the structure 100, 200. They can be utilized in combination, and do not have to be identical among different device layers. These configurations are also applicable to other pixel structures described herein according to other embodiments of the present invention.

In one configuration according to an example embodiment, the bottom contact 300 of the micro-LED 302 comprises a non-epi layer 304, which is conductive and forms ohmic contact with the doped epi 306. The non-epi layer 304 preferably exhibits high-reflectivity to the light emitted from the micro-LED 302. The micro-LED epi 308 in this configuration comprises light emitting epi layers 310 sandwiched between doped epi layers 306, 312, as is understood by a person skilled in the art.

In one configuration according to another example embodiment, the bottom contact 300 of the micro-LED 302 comprises a non-epi layer 314, which can, for example, comprise DBR, transparent conducting oxide, metal etc., or a combination. Non-epi layer 314 can be conductive for current spreading, or non-conductive. The non-epi layer 314 preferably exhibits high reflectivity for the light emitted from the micro-LED 302. The micro-LED epi 308 in this configuration comprises light emitting epi layers 316 sandwiched between doped epi layers 318, 320, as is understood by a person skilled in the art.

Figure 4:
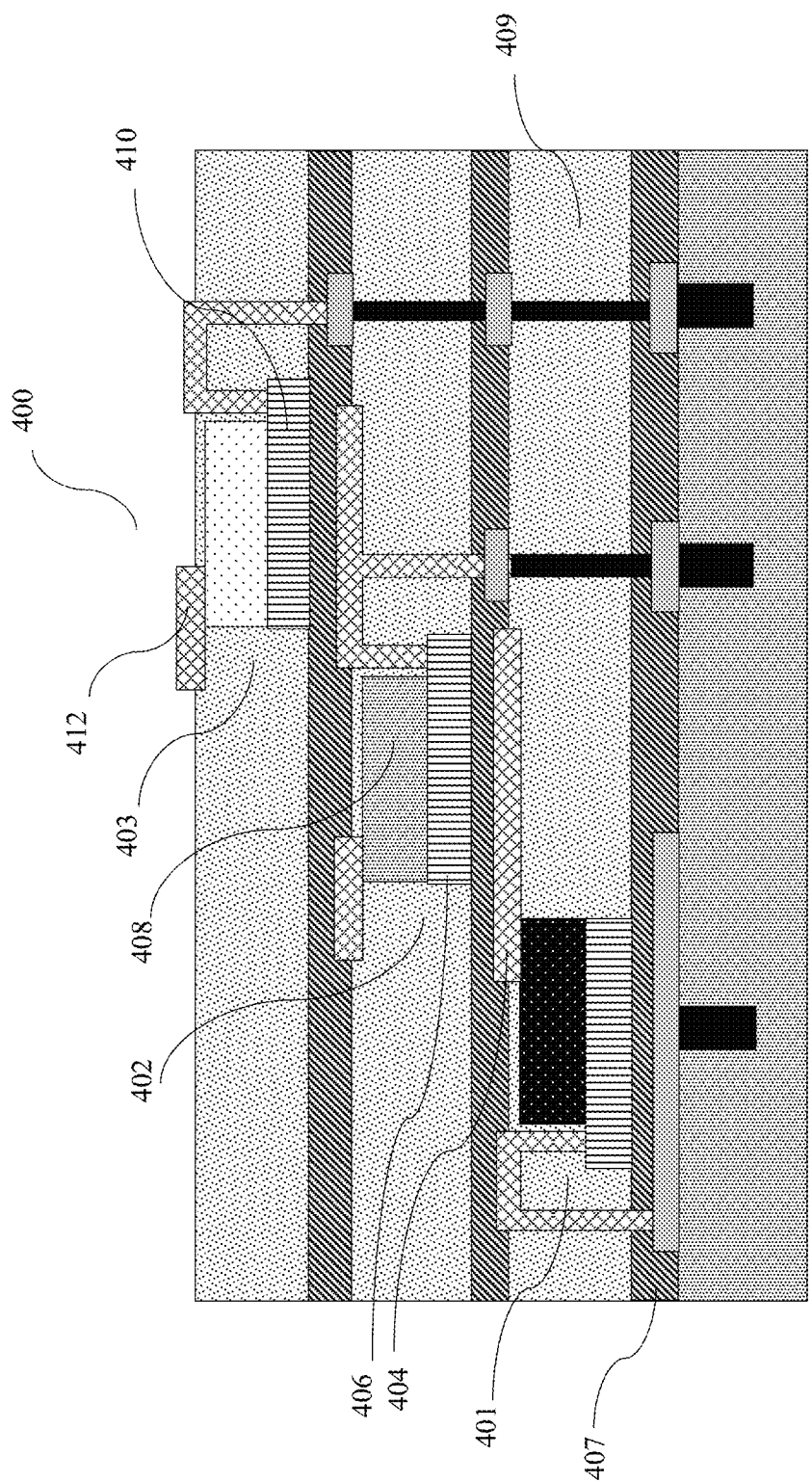
FIG. 4 shows a cross-sectional schematic drawing illustrating an integrated structure for an optoelectronic device in the form of a pixel structure with R, G, B micro-LEDs interlaced horizontally, according to an example embodiment.

FIG. 4 shows a cross-sectional schematic drawing illustrating a pixel structure 400 according to another example embodiment with R, G, B micro-LEDs 401-403 interlaced horizontally. In this example embodiment, the interconnection metal e.g. 404 for the micro-LED e.g. 401 from the lower device level functions as bottom reflector for the micro-LEDs e.g. 402 in the upper device level. Again, transparent bonding dielectric e.g. 407, made from, for example, SiO2, SiN, BCB, etc., are used for integrating the vertically stacking the micro-LEDs 401-403 in this example embodiment. Also, transparent filling e.g. 409 is used again in the device layers.

More specifically, in this example embodiment the interconnection metal e.g. 404 can function as a non-transparent bottom reflector for the micro-LEDs e.g. 402, with the micro-LEDs 401-403 placed interlaced horizontally. When the micro-LEDs 401-403 are horizontally interlaced, and the micro-LED bottom contact e.g. 406 is transparent, the interconnection metal e.g. 404 from the lower device layer can be used as bottom reflector for the upper device layer, as mentioned above. The separation between interconnection metal e.g. 404 and micro-LED epi e.g. 408 can preferably be engineered to achieve optimal reflection condition according to an example embodiment, i.e. can be provided as an optical detected resonance, ODR, structure. In an example embodiment, the 3D arrangement of micro-LEDs and interconnects is preferably optimized to maximize the filling ratio and current loading capability. When R,G, B micro-LEDs 401-403 are horizontally interlaced, the color sequence from top layer to the bottom layer does not have to be B, G, R as described above for the pixel structure 100, 200.

It is noted that the horizontally interlaced configuration and the overlapped configuration (compare FIGS. 1 and 2) can be implemented simultaneously within the same micro-LED micro display in different example embodiments.

In the pixel structure 400, the bottom contact e.g. 410 can still be implemented to function as a reflector. For example, a non-epi layer (compare FIG. 3) such as DBR, microstructure can still be implemented to further enhance the bottom reflection and light extraction. Transparent current spreading layer(s) (compare FIG. 2) can optionally be included. For the common electrode (not shown) interconnection metal pad/line/net e.g. 412 are provided in an example embodiment to connect the top-contacts of micro-LEDs e.g. 403 in the same device layer to a common electrode (not shown). The common electrodes from different device layers can be interconnected.

Figure 5:
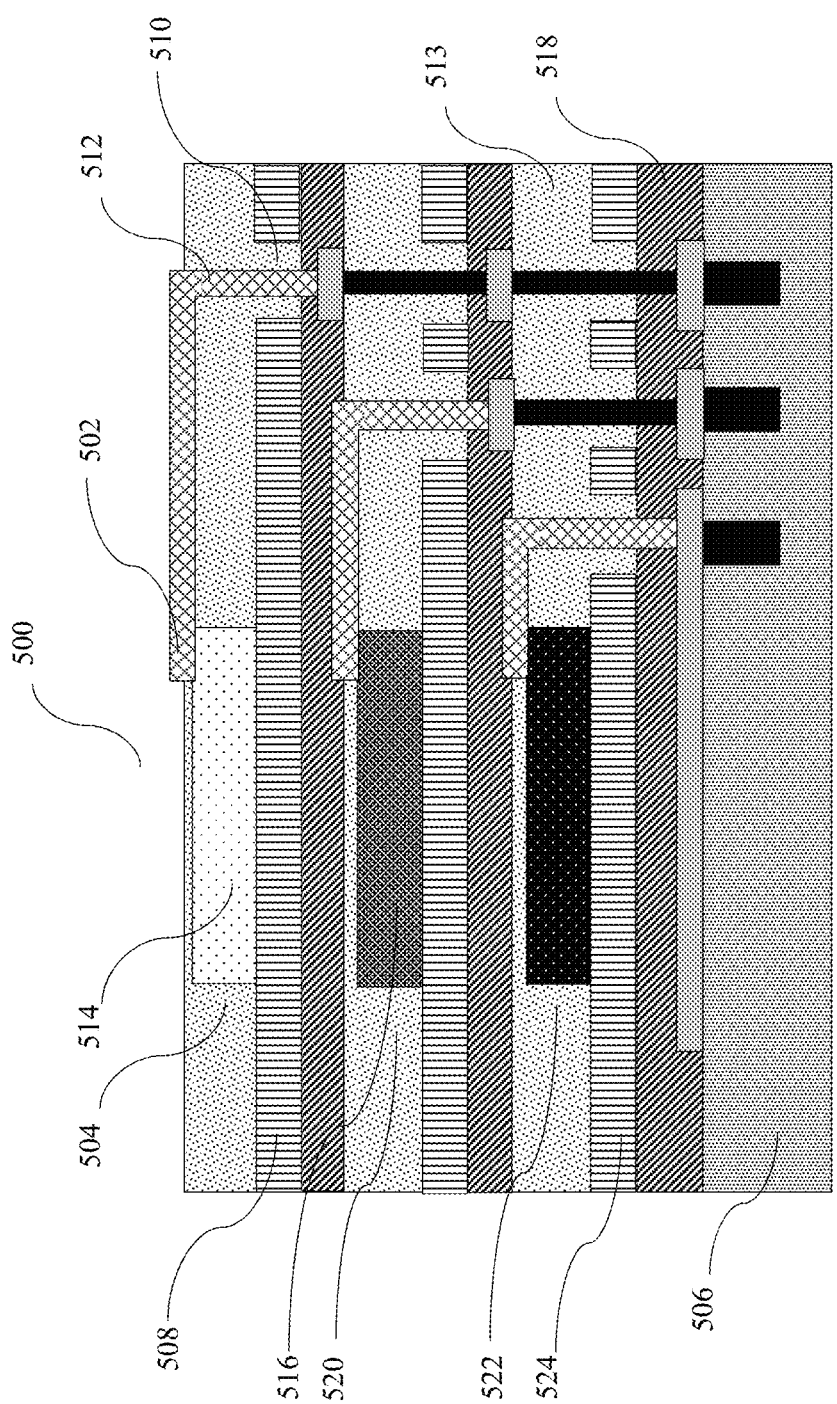
FIG. 5 shows a cross-sectional schematic drawing illustrating an integrated structure for an optoelectronic device in the form of a pixel structure for active-matrix micro-LED micro display with vertically stacked R, G, B micro-LEDs integrated through transparent dielectric bonding medium, according to an example embodiment.

FIG. 5 shows a cross-sectional schematic drawing illustrating a pixel structure 500 for active-matrix micro-LED micro display with vertically stacked R, G, B micro-LEDs integrated through transparent dielectric bonding medium, according to an example embodiment. The top p-contact e.g. 502 of each micro-LED e.g. 504 is individually connected to the driver circuit (not shown) in the display backplane 506. The bottom n-contact e.g. 508 of each micro-LED e.g. 504 of the same color are continuous, with opening window(s) e.g. 510 for the p-contact interconnection(s) e.g. 512. Also, transparent filling e.g. 513 is used again in the device layers.

In this example embodiment, the micro-LED epi e.g. 514 on top has larger bandgap energy than the micro-LED epi e.g. 516 below.

Again, transparent bonding dielectric e.g. 518, made from, for example, SiO2, SiN, BCB, etc., are used for integrating the vertically stacking the micro-LEDs 504, 520, 522 in this example embodiment.

In this embodiment, the bottom n-contact e.g. 508 is implemented as a common electrode layer, which is electrically conductive and optically transparent to the light emitted from the micro-LED e.g. 516 below it. The n-contact e.g. 508 can comprise part of doped portions of the micro-LED epi e.g. 514, and conductive material that forms ohmic contact with the micro-LED epi e.g. 514, and functions as an optical reflector that preferably exhibits high optical reflectivity to the light emitted from the LEDs e.g. 504 above, and high transmittance to the light emitted from the LEDs e.g. 520 below it. In this embodiment, the n-contact e.g. 508 is electrically continuous.

For the bottom micro-LED 522 layer, non-transparent metal can be implemented as the ohmic n-contact 524 functioning as optical reflector.

Optical isolation trenches can be incorporated in the contacts e.g. 508, 524 layers to prevent optical crosstalk between pixels. Metal pads, lines, or nets can be patterned in direct contact with the top of the n-contacts e.g. 508, 524 layers to enhance the current spreading.

The p-contacts e.g. 502 provide the electrical interconnection with appropriate composition, including ohmic contact, vertical interconnects e.g. 512, horizontal interconnects, passivation, adhesion etc. The conductive part of the p-contact e.g. 502 can comprise one or more electrically conducting materials, e.g. metal or transparent conducting material etc.

Figure 6:
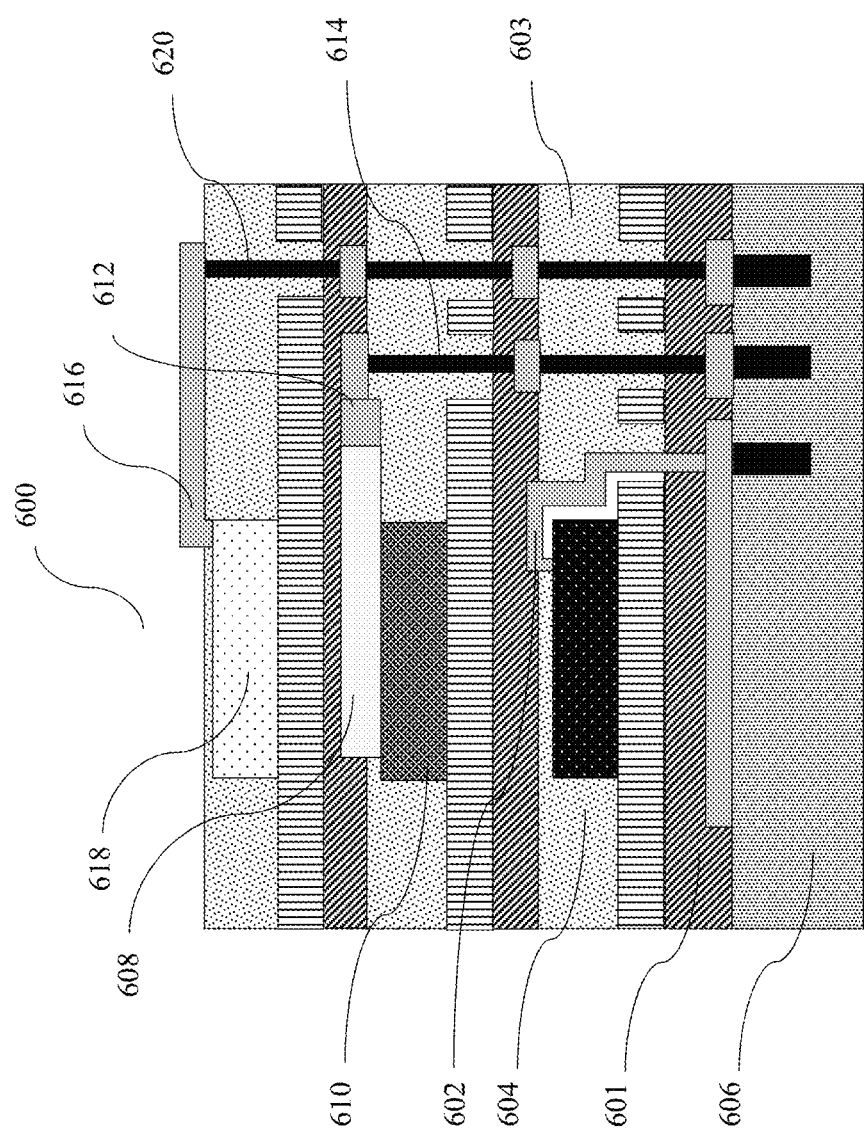
FIG. 6 shows a cross-sectional schematic drawing illustrating different configurations to establish the electric interconnection in a pixel structure, according to different example embodiments.

FIG. 6 shows a cross-sectional schematic drawing illustrating different configurations to establish the electric interconnection in pixel structure 500, indicated as numeral 600 in FIG. 6, according to example embodiments, including transparent bonding dielectric e.g. 601 for monolithic integration. Also, transparent filling e.g. 603 is used again in the device layers.

It is noted that the different configurations for the electrical interconnection as illustrated in FIG. 6 are generally applicable to any of the device layers in the pixel structure 600. They can be utilized in combination, and do not have to be identical among different device layers. These configurations are also applicable to other pixel structures described herein according to other embodiments of the present invention.

In one configuration according to an example embodiment, metal or transparent conducting oxide interconnect 602 is used to directly connect the micro-LED 604 top contact and the driver circuit (not shown) in the display backplane 606.

In one configuration according to another example embodiment, transparent conducting oxide 608 is used to form ohmic contact with the micro-LED epi 610. Metal pad 612 in contact with the transparent conduction oxide 608 establishes electrical connection with the tungsten plug 614.

In one configuration according to another example embodiment, metal pad 616 touches part of the micro-LED epi 618 top surface and forms ohmic contact with the micro-LED epi 618. The metal pad 616 is connected with the tungsten plug 620 that is used for vertical interconnection.

Figure 7:
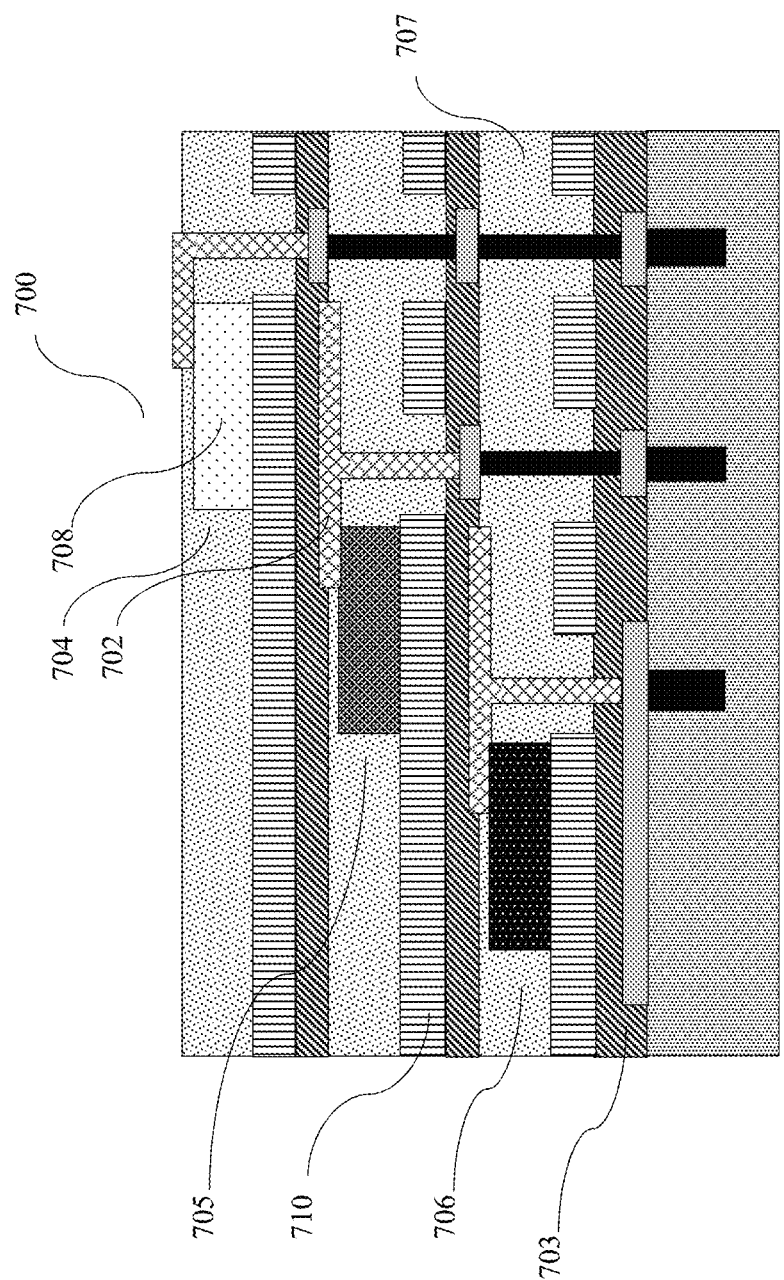
FIG. 7 shows a cross-sectional schematic drawing illustrating an integrated structure for an optoelectronic device in the form of a pixel structure with R, G, B micro-LEDs interlaced horizontally, according to an example embodiment.

FIG. 7 shows a cross-sectional schematic drawing illustrating a pixel structure 700 with R, G, B micro-LEDs interlaced horizontally, according to an example embodiment. In this embodiment, the interconnection metal pad e.g. 702 functions as bottom reflector for the micro-LEDs e.g. 704 in the layer above. Again, transparent bonding dielectric e.g. 703 is used for monolithic integration. Also, transparent filling e.g. 707 is used again in the device layers.

More specifically, when the micro-LEDs 704-706 are horizontally interlaced, the interconnection metal pad e.g. 702 from the lower device layer can be utilized as bottom reflector of the micro-LED e.g. 704 at upper device layer. The separation between the metal pad e.g. 702 and the micro-LED epi e.g. 708 can preferably be engineered to achieve optimal reflection condition, i.e. providing an ODR structure. In an example embodiment, the 3D arrangement of micro-LEDS and interconnects is optimized to maximize the filling ratio and current loading capability. When R, G, B micro-LEDs are horizontally interlaced, the color sequence from top layer to the bottom layer does not have to be B, G, R.

It is noted that horizontally interlaced micro-LEDs and overlapped micro-LEDs (compare FIGS. 5 and 6) can be implemented simultaneously within the same micro-LED micro display. It is noted that when R,G, B micro-LEDs 704-706 are horizontally interlaced in this example embodiment, the color sequence from top layer to the bottom layer does not have to be B, G, R.

In the pixel structure 700, the bottom contact e.g. 710 can still be implemented to function as a reflector. For example, a non-epi layer (compare FIG. 3) such as DBR, micro-structure can still be implemented to further enhance the bottom reflection and light extraction in an example embodiment. Transparent current spreading layer(s) (compare FIG. 6) are preferably used.

Figure 8A:
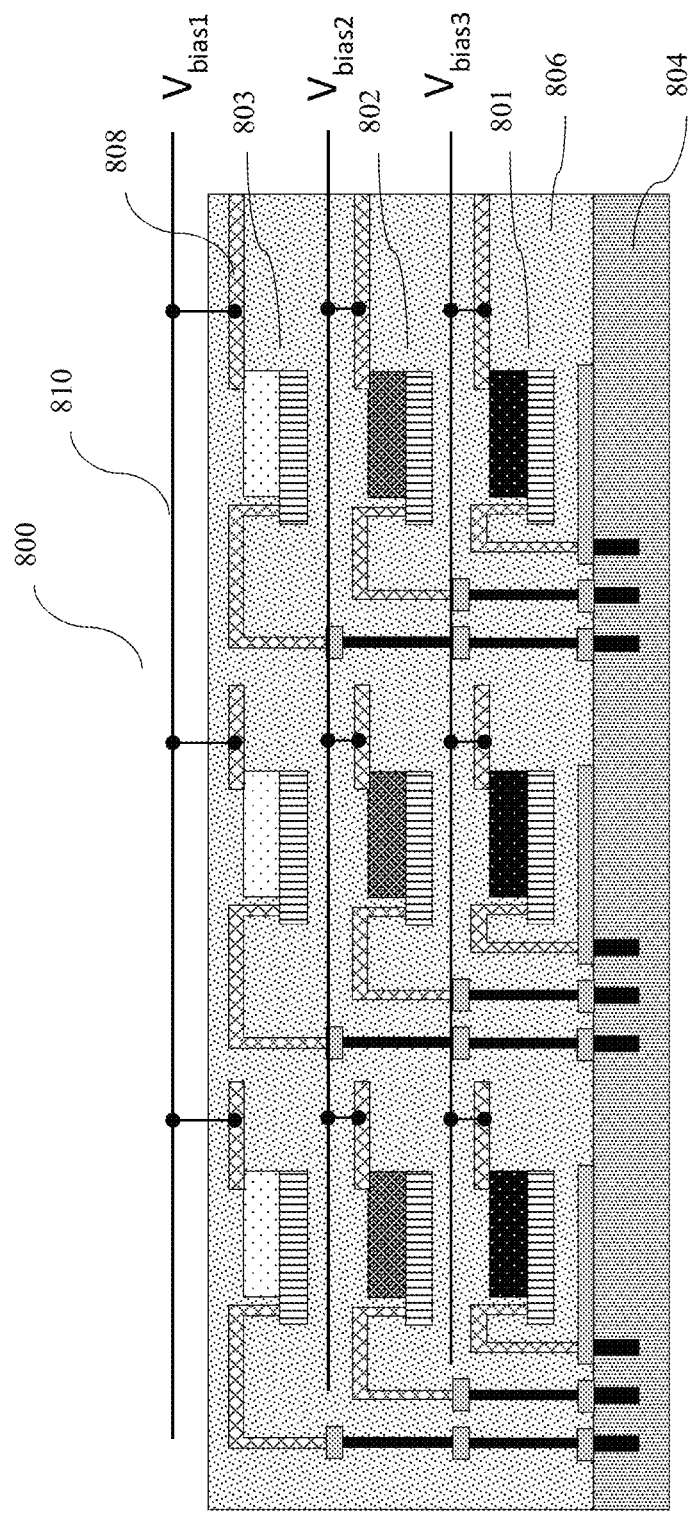
FIG. 8(a) shows a cross-sectional schematic drawing illustrating an integrated structure for an optoelectronic device in the form of a full-color micro-LED array with stacked R, G, B micro-LED layers integrated on CMOS backplane, according to an example embodiment.

FIG. 8a) shows a cross-sectional schematic drawing illustrating a full-color micro-LED array 800 with stacked R, G, B micro-LED 801-803 layers integrated on CMOS backplane 804, according to an example embodiment. Each micro-LED 801-803 is individually connected to a pixel driver circuit (not shown) in the CMOS backplane 804 and shares a common bias with micro-LEDs within the same device layer. In different embodiments of a full-color micro LED array, an interlaced pixel structure according to example embodiments described above can be used. It is noted that the bonding dielectric used for the integration of the device layers according to example embodiments are not explicitly shown in FIG. 8. Instead, the bonding dielectric is "merged" with the transparent filling e.g. 806 in FIG. 8a).Top contacts e.g. 808 of micro-LEDs e.g. 803 of the same device layer are connected to a common electrode, indicated as line 810 in FIG. 8a). The corresponding bias voltages $V_{bias1}$ $V_{bias2}$ $V_{bias3}$ can be the same or different, depending on the CMOS driver circuit design, as is understood by a person skilled in the art.

Figure 8B:
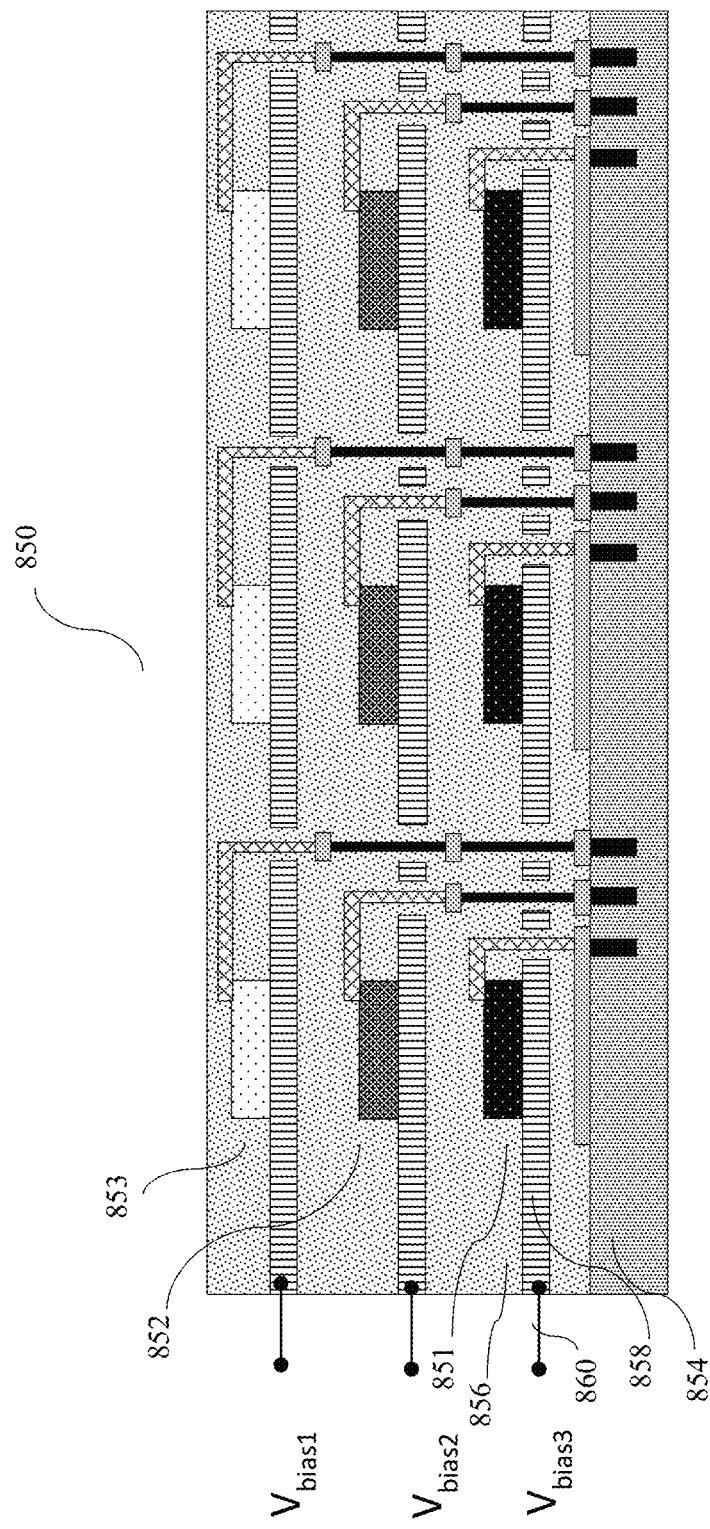
FIG. 8(b) shows a cross-sectional schematic drawing illustrating an integrated structure for an optoelectronic device in the form of a full-color micro-LED array with stacked R, G, B micro-LED layers integrated on CMOS backplane, according to an example embodiment.

FIG. 8b) shows a cross-sectional schematic drawing illustrating a full-color micro-LED array 850 with stacked R, G, B micro-LED 851-853 layers integrated on CMOS backplane 854, according to an example embodiment. Each micro-LED 851-853 is individually connected to a pixel driver circuit (not shown) in the CMOS backplane 854 and shares a common bias with micro-LEDs within the same device layer. In different embodiments of a full-color micro LED array, an interlaced pixel structure according to example embodiments described above can be used. It is noted that the bonding dielectric used for the integration of the device layers according to example embodiments are not explicitly shown in FIG. 8.b). Instead, the bonding dielectric is "merged" with the transparent filling e.g. 856 in FIG. 8b).

Bottom contacts e.g. 858 of micro-LEDs e.g. 851 of the same device layer are connected to a common electrode, indicated as line 860 in FIG. 8b). The corresponding bias voltages $V_{bias1}$ $V_{bias2}$ $V_{bias3}$ can be the same or different, depending on the CMOS driver circuit design, as is understood by a person skilled in the art.

Figure 9:
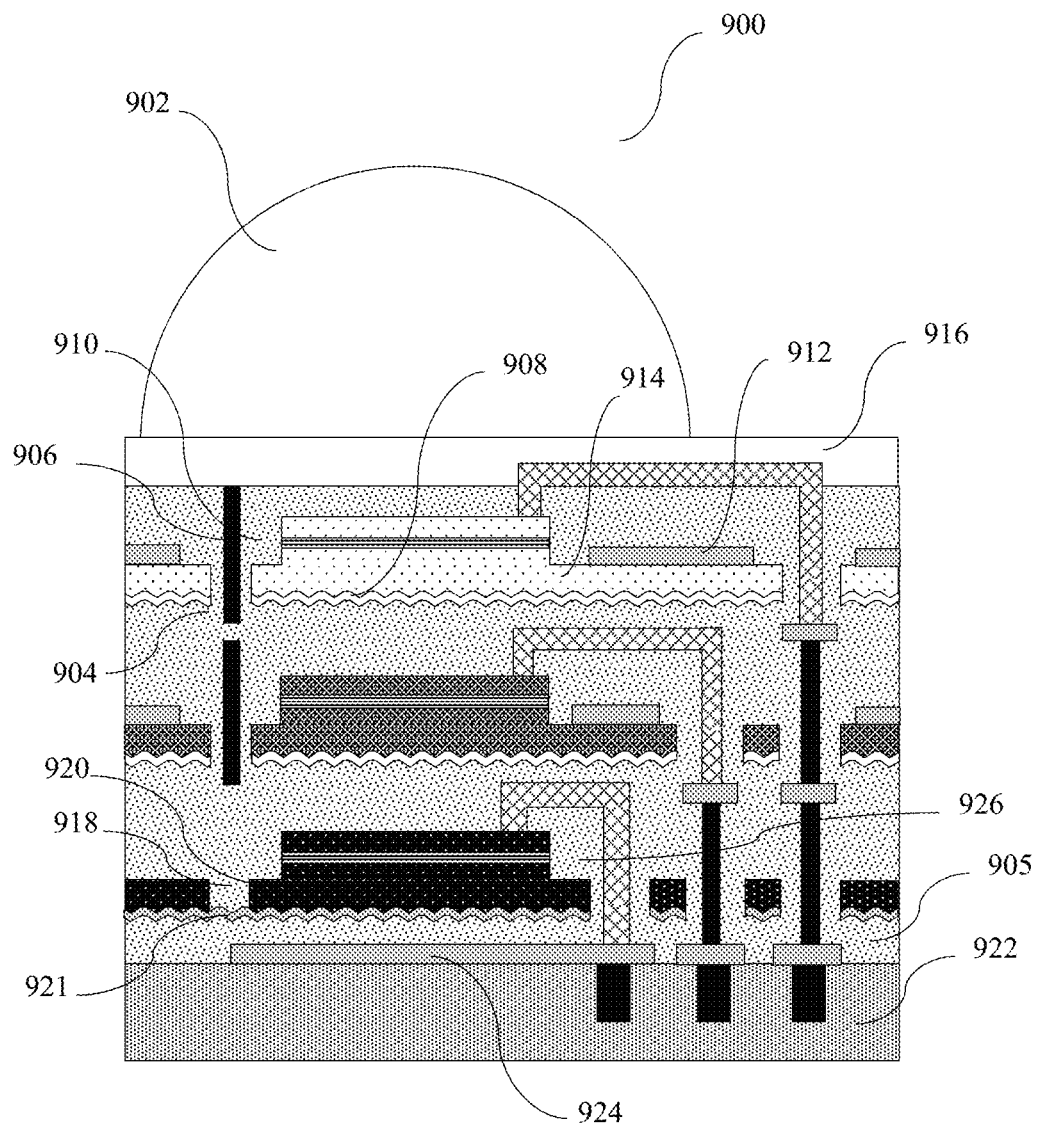
FIG. 9 shows a cross-sectional schematic drawing illustrating an integrated structuring within a single RGB pixel, including micro-lens, optical isolation trench, redundant tungsten plug, micro-structure patterned over the LED bottom, the current spreading metal pad on n-contact layer, according to example embodiments.

FIG. 9 shows a cross-sectional schematic drawing illustrating an integrated structuring within a single RGB pixel 900, including micro-lens 902, optical isolation trench 904, redundant tungsten plug e.g. 906, back reflector e.g. 908 with micro-structure pattern on the micro-LED e.g. 910 bottom, and current spreading metal pad e.g. 912 on n-contact e.g. 914 layer, according to an example embodiment. In various embodiments, integrated pixel structure does not necessarily include all, but can be any combination of those features, depending e.g. on the fabrication complexity and device performance required.

It is noted that the bonding dielectric used for the integration of the device layers according to example embodiments are not explicitly shown in FIG. 9. Instead, the bonding dielectric is "merged" with the transparent filling e.g. 915 in FIG. 9.

Spacer 916 can be provided to adjust the separation between microlens 902 and the LEDs e.g. 910 transparent ohmic contact (e.g. ITO), the transparent back reflector e.g. 908 (e.g. DBR) with micro-structure pattern. The redundant tungsten plug e.g. 906 can be provided for light blocking to prevent inter-pixel crosstalk. Metal pad e.g. 912, for example Al, in direct contact with the n-contact e.g. 914 can be provided to improve the current spreading. Optical isolation trench e.g. 904 etching through the common n-contact e.g. 914 layer. The trench e.g. 904 features segments without forming closed loop to ensure electrical continuity among all the micro-LEDs in each device layer. It is noted that a current spreading, ohmic contact, back reflector layer 908 with micro-pattern for the bottom device layer can comprise a non-transparent metal. An optical isolation trench 918 etched through the epi 920 in the bottom device layer can be provided, stopped at the bottom current spreading ohmic contact, back reflector layer 921.

IC electrode pad 924 of the CMOS backplane 922, can serve as optical reflector for the bottom micro-LED 926 if the current spreading, ohmic contact, back reflector layer 921 is transparent.

Figure 10:
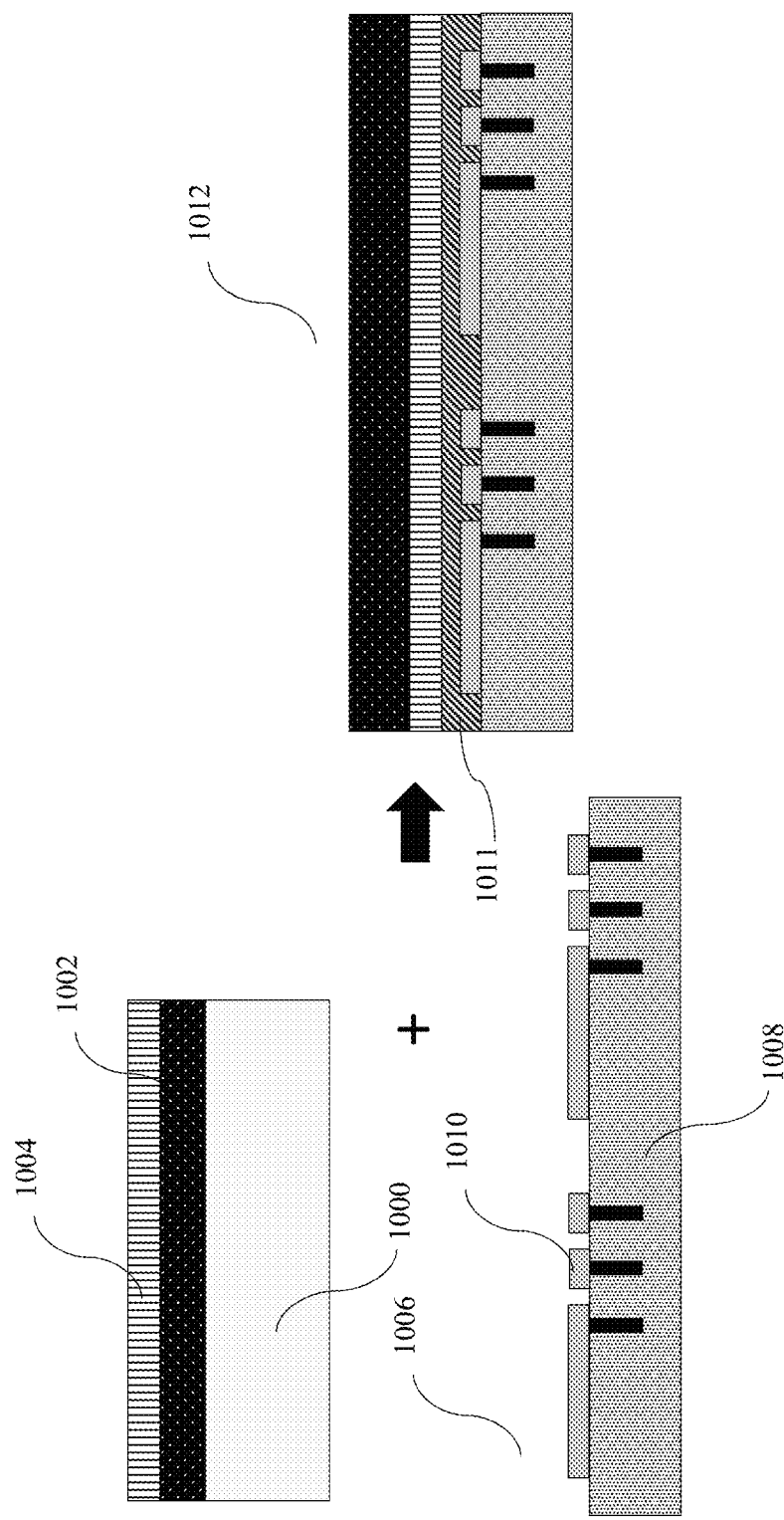
FIG. 10 shows cross-sectional schematic drawings illustrating processing steps in a fabrication method according to an example embodiment.

FIG. 10 shows cross-sectional schematic drawings illustrating a fabrication process according to an example embodiment for fabricating the pixel structure 100, 200 as an example, noting that the same procedure can be employed for realizing pixel structures 400, 500, 600, 700, 900. Similarly, the same procedure can be employed for realizing the full-color micro-LED array 800, 850.

On a substrate 1000, which can be the as-grown epi substrate or a handle wafer, the epitaxial material 1002 with light emitting layers (e.g. quantum well) incorporated and doped contact layer at top and bottom of the light emitting layers is provided. Contact and reflector layer 1004 is also provided, which can comprise of part of doped epi, conductive material that forms ohmic contact with the epi, optical reflector with desired reflection and transmission characteristics, and micro-structures (periodic, such as Bragg grating structures or photonic crystal structures, or non-periodic).

A pixel set 1006 with independent driver circuit for R, G, B is provided in a CMOS driver circuit wafer 1008, with electrical pads e.g. 1010 provided for interconnection.

Dielectric wafer bonding with a transparent bonding dielectric 1011 is used between the substrate 1000 (face down) and the CMOS driver circuit wafer 1008 (face up), followed by substrate 1000 removal, yielding the structure 1012.

With reference to FIG. 11, dry etching is used to pixelate micro-LEDs e.g. 1014, followed by establishing ohmic contact to the micro-LED e.g. 1014 epi 1016, including establishing electrical connection e.g. 1018 between the micro-LED e.g. 1014 and the driver circuit in the CMOS driver circuit wafer 1008, and simultaneously forming vertical interconnects e.g. 1020 (for example tungsten plug) for the micro-LEDs (not shown) in the next device layer(s) to be integrated. Also, transparent filling e.g. 1021 is provided in the device layers.

With reference to FIG. 12, the second epi-layer 1022 and contact and reflector layer 1024 is integrated through dielectric wafer bonding using a transparent bonding dielectric 1025, correspondingly to the dielectric wafer bonding between CMOS driver circuit wafer 1008 and substrate 1000 with reference to FIG. 10, including substrate removal. Next the micro-LEDs e.g. 1026 of second device layer are patterned and associated electrical connection and ohmic contacts are formed, correspondingly to what has been described above with reference to FIG. 11 for the first device layer.

Figure 13:
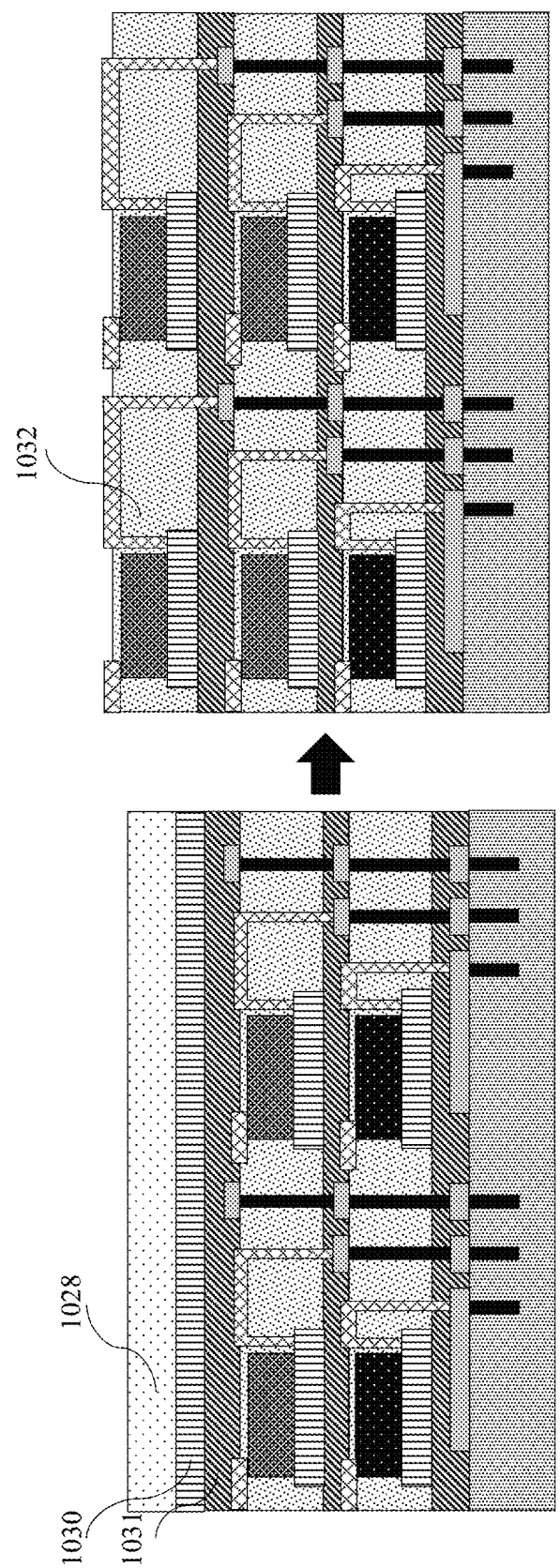
FIG. 13 shows cross-sectional schematic drawings illustrating processing steps in a fabrication method according to an example embodiment.

With reference to FIG. 13, the third epi-layer 1028 and contact and reflector layer 1030 is integrated through dielectric wafer bonding using a transparent bonding dielectric 1031, again correspondingly to the dielectric wafer bonding between CMOS driver circuit wafer 1008 and substrate 1000 with reference to FIG. 10, including substrate removal. Next the micro-LEDs e.g. 1032 of third device layer are patterned and associated electrical connection and ohmic contacts are formed, correspondingly to what has been described above with reference to FIG. 11 for the first device layer.

In one embodiment, an integrated structure for an optoelectronic device is provided, the integrated structure comprising a complementary metal-oxide-semiconductor, CMOS, backplane comprising a driver circuit for the optoelectronic device; a plurality of optical elements on the CMOS backplane, wherein the plurality of optical elements are based on a material system different from CMOS and are disposed in different device layers; a first bonding dielectric provided between the CMOS backplane and a first one of the different device layers for monolithic integration; and a second bonding dielectric provided between respective ones of the different device layers for monolithic integration, the second bonding dielectric being transparent.

The second bonding dielectric may be the same as the first bonding dielectric.

Each device layer may comprise a reflector disposed below a first optical element in said each device layer, wherein the reflector is configured to be reflective at a first operating wavelength range of a first optical element. The reflector may be configured to be transmissive at a second operating wavelength range of a second optical element in a lower device layer. The reflector may comprise a distributed Bragg reflector, DBR. At least a portion of an electrical interconnection metal in each device layer may function as the reflector.

Respective top contacts of the optical elements in the same device layer may be connected to a common top electrode, and respective bottom contacts of the optical elements in the same device layer are individually connected to the driver circuit.

Respective bottom contacts of the optical elements in the same device layer may be connected to a common electrode, and respective top contacts of the optical elements in the same device layer are individually connected to the driver circuit. The integrated structure may comprise micro-trenches patterned between optical elements in the same device layer through the common bottom electrode to achieve optical isolation between the optical elements in the same device layer without breaking the electrical continuity of the common bottom electrode. The integrated structure may comprise metal pads, lines or net patterned on the common bottom electrode with direct electrical contact to enhance current spreading.

The integrated structure may comprise micro-structures patterned on respective bottom layers of the optical elements to enhance a light extraction from the optical elements.

The integrated structure may comprise a photonic crystal structure patterned on respective bottom layers of the optical elements to increase an emission directionality of light from the optical elements.

At least some of the optical elements in different device layer may be horizontally interlaced.

At least some of the optical elements in different device layer may at least partially overlap. The optical devices may comprise at least partially overlapping RGB micro-light emitting diodes, micro-LEDs, in a pixel arrangement for enhancing color mixing.

The integrated structure may further comprise electrical interconnections including one or more of a group consisting of chemical mechanical planarization based contact, tungsten plug, and metal pad.

The integrated structure may further comprise at least one micro-lens to assist light collimation.

The integrated structure may comprise one or more redundant tungsten plugs to prevent crosstalk between adjacent optical elements.

Figure 14:
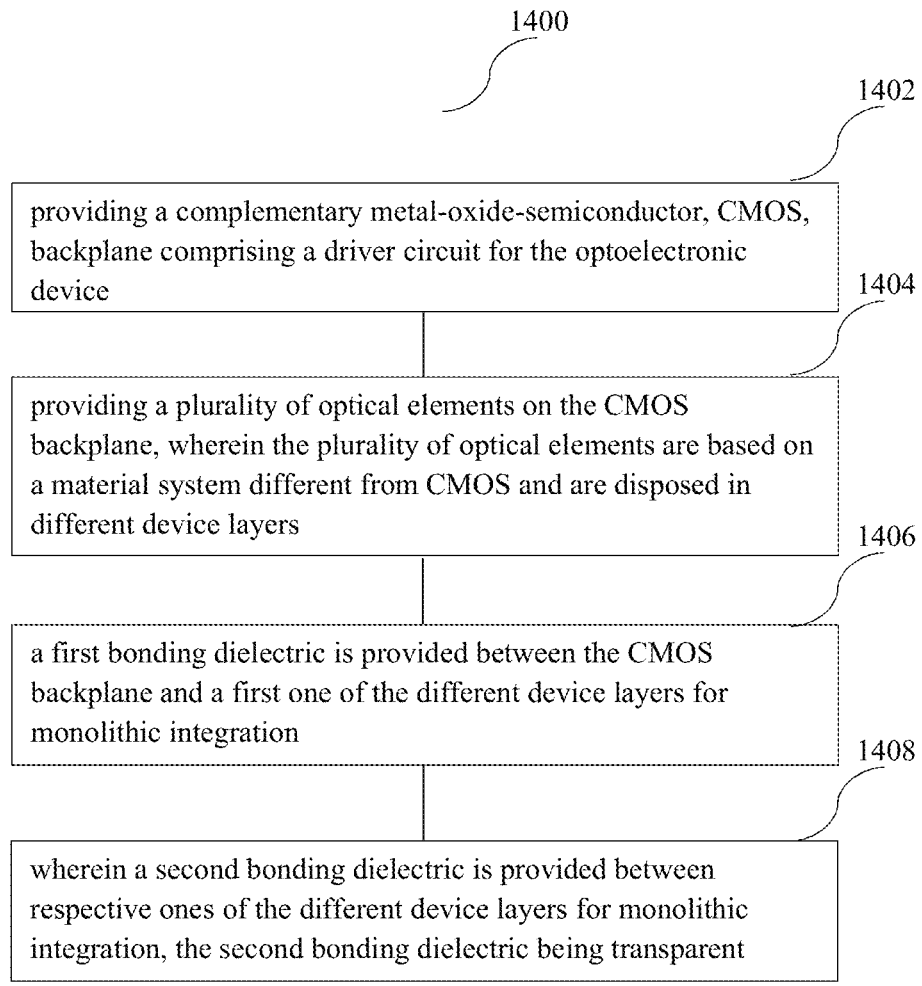
FIG. 14 shows a flowchart illustrating a method of fabricating an integrated structure for an optoelectronic device, according to an example embodiment.

FIG. 14 shows a flowchart 1400 illustrating a method of fabricating an integrated structure for an optoelectronic device, according to an example embodiment. At step 1402, a complementary metal-oxide-semiconductor, CMOS, backplane comprising a driver circuit for the optoelectronic device is provided. At step 1404, a plurality of optical elements are provided on the CMOS backplane, wherein the plurality of optical elements are based on a material system different from CMOS and are disposed in different device layer. At step 1406, a first bonding dielectric is provided between the CMOS backplane and a first one of the different device layers for monolithic integration. At step 1408, a second bonding dielectric is provided between respective ones of the different device layers for monolithic integration, the second bonding dielectric being transparent.

The second bonding dielectric may be the same as the first bonding dielectric.

The method may comprise providing, in each device layer, a reflector disposed below a first optical element in said each device layer, wherein the reflector is configured to be reflective at a first operating wavelength range of a first optical element. The reflector may be configured to be transmissive at a second operating wavelength range of a second optical element in a lower device layer. The reflector may comprise a distributed Bragg reflector, DBR.

The method may comprise providing, in each device layer, an electrical interconnection metal, wherein at least a portion of an electrical interconnection metal functions as the reflector.

The method may comprise connecting respective top contacts of the optical elements in the same device layer to a common top electrode, and connecting respective bottom contacts of the optical elements in the same device layer individually to the driver circuit.

The method may comprise connecting respective bottom contacts of the optical elements in the same device layer to a common electrode, and connecting respective top contacts of the optical elements in the same device layer individually to the driver circuit. The method may comprise patterning micro-trenches between optical elements in the same device layer through the common bottom electrode to achieve optical isolation between the optical elements in the same device layer without breaking the electrical continuity of the common bottom electrode. The method may comprise patterning metal pads, lines or net on the common bottom electrode with direct electrical contact to enhance current spreading.

The method may comprise patterning micro-structures on respective bottom layers of the optical elements to enhance a light extraction from the optical elements.

The method may comprise patterning a photonic crystal structure on respective bottom layers of the optical elements to increase an emission directionality of light from the optical elements.

The method may comprise horizontally interlacing at least some of the optical elements in different device layer.

The method may comprise at least partially overlapping at least some of the optical elements in different device layer. The method may comprise at least partially overlapping RGB micro-light emitting diodes, micro-LEDs, in a pixel arrangement for enhancing color mixing.

The method may further comprise providing electrical interconnections including one or more of a group consisting of chemical mechanical planarization based contact, tungsten plug, and metal pad.

The method may further comprise providing at least one micro-lens to assist light collimation.

The method may comprise providing one or more redundant tungsten plugs to prevent crosstalk between adjacent optical elements.

INDUSTRIAL APPLICATIONS

The monolithic full-color active matrix micro-LED micro-display according to example embodiments is particularly interesting for, but not limited to, AR, HUD applications which require compact, efficient, high-resolution (>1000 ppi) and high-brightness (>500,000 nits) full-color micro-display. It can also be used in mobile or wearable video projector with extensive application examples.

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

For example, the device architecture and fabrication approach according to example embodiments can be implemented to any other apparatus, including any other semiconductor apparatus, that requires hybrid integration of optoelectronic device of different material systems on the CMOS wafer, for example, stacking R, G, B vertical cavity surface emitting laser, VCSEL, to give a white laser or integrating visible and infra-red, IR, LEDs for video projection and 3D scanning. Also, other than light-emitting devices, embodiments of the present invention can also be implemented to light detection systems such as focal plane array or hybrid integration of display and sensor.

The elements and acts of the various embodiments described above can be combined to provide further embodiments. These and other changes can be made to the systems and methods in light of the above detailed description.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

REFERENCES

[1] Y. Robin et al. "Insight into the performance of multi-color InGaN/GaN nanorod light emitting diodes", Scientific Reports 8, 7311 (2018)

[2] El-Ghoroury et al. "Light emitting structures with multiple uniformly populated active layers", US Patent No. US2016/0359086 (2016).

[3] H.-V. Han et al. "Resonant-enhanced full-color emission of quantum-dot-based micro LED display technology" Optics Express 23, 32504 (2015)

[4] Chong et al. "Making Semiconductor devices by stacking strata of micro LEDs", International Publication Number WO 2018/175338 (2018)

The invention claimed is:

1. An integrated structure for an optoelectronic device, the integrated structure comprising:
   a complementary metal-oxide-semiconductor, CMOS, backplane comprising a driver circuit for the optoelectronic device;
   a plurality of optical elements on the CMOS backplane, wherein the plurality of optical elements are based on a material system different from CMOS and are disposed in different device layers, each optical element comprising of a light emitting layer disposed between top and bottom contact layers;

a first bonding dielectric provided between the CMOS backplane and a first one of the different device layers for monolithic integration; and a second bonding dielectric provided between respective ones of the different device layers for monolithic integration, the second bonding dielectric being transparent;

wherein, for each of the device layers, the driver circuit is connected to the optical element in the device layer via a vertical interconnect formed in a dielectric material of the device layer, wherein the vertical interconnect is connected to a surface of one of the top and bottom contact layers, said surface facing away from the CMOS backplane; and/or wherein the integrated structure comprises one or more redundant tungsten plugs to prevent crosstalk between adjacent optical elements.

2. The integrated structure of claim 1, wherein the second bonding dielectric is the same as the first bonding dielectric.

3. The integrated structure of claim 1, wherein each device layer comprises a reflector disposed below a first optical element in said each device layer, wherein the reflector is configured to be reflective at a first operating wavelength range of a first optical element, and optionally wherein the reflector is configured to be transmissive at a second operating wavelength range of a second optical element in a lower device layer and/or optionally wherein the reflector comprises a distributed Bragg reflector, DBR, and/or optionally wherein at least a portion of an electrical interconnection metal in each device layer functions as the reflector.

4. The integrated structure of claim 1, wherein respective top contacts of the optical elements in the same device layer are connected to a common top electrode, and respective bottom contacts of the optical elements in the same device layer are individually connected to the driver circuit.

5. The integrated structure of claim 1, wherein respective bottom contacts of the optical elements in the same device layer are connected to a common electrode, and respective top contacts of the optical elements in the same device layer are individually connected to the driver circuit, and optionally comprising micro-trenches patterned between optical elements in the same device layer through the common bottom electrode to achieve optical isolation between the optical elements in the same device layer without breaking the electrical continuity of the common bottom electrode, and/or optionally comprising metal pads, lines or net patterned on the common bottom electrode with direct electrical contact to enhance current spreading.

6. The integrated structure of claim 4, comprising microstructures patterned on respective bottom layers of the optical elements to enhance a light extraction from the optical elements.

7. The integrated structure of claim 4, comprising a photonic crystal structure patterned on respective bottom layers of the optical elements to increase an emission directionality of light from the optical elements.

8. The integrated structure of claim 1, wherein at least some of the optical elements in different device layer are horizontally interlaced, and/or optionally further comprising electrical interconnections including one or more of a group consisting of chemical mechanical planarization based contact, tungsten plug, and metal pad, and/or optionally further comprising at least one micro-lens to assist light collimation.

9. The integrated structure of claim 1, wherein at least some of the optical elements in different device layer at least partially overlap, and optionally wherein the optical devices comprise at least partially overlapping RGB micro-light emitting diodes, micro-LEDs, in a pixel arrangement for enhancing color mixing.

10. The integrated structure of claim 1, wherein the driver circuit is connected to one or more of the device layers via an interface between a metal layer of the driver circuit and a vertical interconnect in the one or more of the device layers.

11. A method of fabricating an integrated structure for an optoelectronic device, the method comprising the steps of:
providing a complementary metal-oxide-semiconductor, CMOS, backplane comprising a driver circuit for the optoelectronic device; and
providing a plurality of optical elements on the CMOS backplane, wherein the plurality of optical elements are based on a material system different from CMOS and are disposed in different device layers, each optical element comprising of a light emitting layer disposed between top and bottom contact layers;
wherein a first bonding dielectric is provided between the CMOS backplane and a first one of the different device layers for monolithic integration; and
wherein a second bonding dielectric is provided between respective ones of the different device layers for monolithic integration, the second bonding dielectric being transparent;
wherein the method further comprises:
for each of the device layers, connecting the driver circuit to the optical element in the device layer via a vertical interconnect formed in a dielectric material of the device layer, wherein the vertical interconnect is connected to a surface of one of the top and bottom contact layers, said surface facing away from the CMOS backplane; and/or
providing one or more redundant tungsten plugs to prevent crosstalk between adjacent optical elements.

12. The method of claim 11, wherein the second bonding dielectric is the same as the first bonding dielectric.

13. The method of claim 11, comprising providing, in each device layer, a reflector disposed below a first optical element in said each device layer, wherein the reflector is configured to be reflective at a first operating wavelength range of a first optical element, and optionally wherein the reflector is configured to be transmissive at a second operating wavelength range of a second optical element in a lower device layer, and/or optionally wherein the reflector comprises a distributed Bragg reflector, DBR, and/or optionally comprising providing, in each device layer, an electrical interconnection metal, wherein at least a portion of an electrical interconnection metal functions as the reflector.

14. The method of claim 11, comprising connecting respective top contacts of the optical elements in the same device layer to a common top electrode, and connecting respective bottom contacts of the optical elements in the same device layer individually to the driver circuit.

15. The method of any claim 11, comprising connecting respective bottom contacts of the optical elements in the same device layer to a common electrode, and connecting respective top contacts of the optical elements in the same device layer individually to the driver circuit, and optionally comprising patterning micro-trenches between optical elements in the same device layer through the common bottom electrode to achieve optical isolation between the optical elements in the same device layer without breaking the electrical continuity of the common bottom electrode, and/or optionally comprising patterning metal pads, lines or net on the common bottom electrode with direct electrical contact to enhance current spreading.

16. The method of claim 14, comprising patterning microstructures on respective bottom layers of the optical elements to enhance a light extraction from the optical elements.

17. The method of claim 14, comprising patterning a photonic crystal structure on respective bottom layers of the optical elements to increase an emission directionality of light from the optical elements.

18. The method of claim 11, comprising horizontally interlacing at least some of the optical elements in different device layer, and/or optionally further comprising providing electrical interconnections including one or more of a group consisting of chemical mechanical planarization based contact, tungsten plug, and metal pad, and/or optionally further comprising providing at least one micro-lens to assist light collimation.

19. The method of claim 11, comprising at least partially overlapping at least some of the optical elements in different device layer, and optionally comprising at least partially overlapping RGB micro-light emitting diodes, micro-LEDs, in a pixel arrangement for enhancing color mixing.

20. The method of claim 11, comprising connecting the driver circuit to one or more of the device layers via an interface between a metal layer of the driver circuit and a vertical interconnect in the one or more of the device layers.

* * * * *